US000001796H

United States Statutory Invention Registration [19]

[11] Reg. Number: H1,796

[45] Published: Jul. 6, 1999

Srivatsa et al.

[54] METHOD AND CIRCUIT FOR ELIMINATING HOLD TIME VIOLATIONS IN SYNCHRONOUS CIRCUITS

[75] Inventors: Chakra R. Srivatsa, San Jose; Ronald J. Melanson, Woodside; David J. Greenhill, Portola Valley, all of Calif.

[73] Assignee: Sun Microsystems, Inc., Palo Alto, Calif.

[21] Appl. No.: 08/646,643

[22] Filed: May 2, 1996

[51] Int. Cl.[6] ..... H03K 3/037

[52] U.S. Cl. ..... 327/215

[58] Field of Search ..... 327/199, 200–203, 327/208–212, 215–218

[56] References Cited

U.S. PATENT DOCUMENTS

| | | | |
|---|---|---|---|
| 4,209,715 | 6/1980 | Aoki | 327/218 |
| 4,785,297 | 11/1988 | Sekiya | 327/202 |
| 5,004,933 | 4/1991 | Widener | 327/218 |
| 5,025,174 | 6/1991 | Shikata | 327/203 |

FOREIGN PATENT DOCUMENTS

| | | | |
|---|---|---|---|
| 2-34018 | 2/1990 | Japan | 327/218 |
| 2-206910 | 8/1990 | Japan | 327/218 |
| 2-280411 | 11/1990 | Japan | 327/218 |
| 3-18116 | 1/1991 | Japan | 327/199 |
| 3-201717 | 9/1991 | Japan | 327/199 |

*Primary Examiner*—Daniel T. Pihulic

[57] ABSTRACT

Circuits and methods for eliminating hold time violations are disclosed. A DE-type flip-flop latches a data input signal on a data input terminal a fraction of a clock period before a triggering edge of the clock signal. The DE-type flip-flop provides a data output signal for a full clock period beginning after the triggering edge of the clock signal. The DE-type flip-flop includes a latch having its data output terminal coupled to the data input terminal of a flip-flop. The flip-flop clock input pin and the latch enable terminal of the latch are connected to a clock line. The DE-type flip-flop used in place of a standard flip-flop, in which a hold time violation occurs, eliminates the hold time violation.

31 Claims, 12 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD AND CIRCUIT FOR ELIMINATING HOLD TIME VIOLATIONS IN SYNCHRONOUS CIRCUITS

CROSS-REFERENCE TO RELATED APPLICATIONS

This application relates to the co-pending application Ser. No. 08/649,901 (Attorney Reference No: M-3813 US), filed May 2, 1996, entitled "A METHOD AND CIRCUIT FOR PREVENTING HOLD TIME VIOLATIONS IN SYNCHRONOUS CIRCUITS", by Srivatsa et al., owned by the assignee of this application and incorporated herein by reference.

BACKGROUND OF THE INVENTION

1. Field of the Invention

This invention relates generally to eliminating race conditions in synchronous circuits and in particular to eliminating violations of the hold time requirement of synchronous flip-flops.

2. Description of Related Art

Sequential circuits use both combinatorial circuits and storage elements. Synchronous circuits are sequential circuits in which the storage elements change their values only during discrete instants of time. Normally synchronization is achieved using a master system clock input signal throughout the system, board, or chip.

A common storage element is the D-type latch. FIGS. 1(*a*) to 1(*d*) show a logic symbol, a timing diagram, and two common implementations of the D-type latch, respectively. FIG. 1(*a*) shows the logic symbol of D-type latch 1310, which has data input terminal D, latch enable terminal LE, data output terminal Q, and inverted data output terminal !Q. To avoid confusion, signals on the various terminals are given the same names as the terminals themselves, whenever possible. When latch enable signal LE is active, D-type latch 1310 outputs on output terminal Q the input signal on data input terminal D. As latch enable signal LE goes inactive, D-type latch 1310 stores and outputs the input signal at the time latch enable signal LE goes inactive and ignores any changes to data input signal D until latch enable signal LE is again active. Typically, for latch enable signal LE, active is high and inactive is low; however, opposite polarity can be used so that active is low while inactive is high. D-type latch 1310 has some inherent propagation delay so that data output signal Q lags data input signal D by propagation delay T_prop.

Specifically, as shown in FIG. 1(*b*), during time interval 1410, data output signal Q is equal to data input signal D after propagation delay T_prop. During time interval 1420, latch enable signal LE is inactive and D-type latch 1310 ignores the transition of input signal D from signal V1 to signal V2. However, after rising edge 1425, when latch enable signal LE is active, data output signal Q transitions to signal V2 after propagation delay T_prop. During time interval 1430, latch enable signal LE remains active so that any changes in data input signal D, such as the transition to signal V3, are reflected in changes to data output signal Q, which also transitions to signal V3. Since the D-type latch can change states during an entire active clock pulse such as interval 1430, the D-type latch is not well suited for use as the storage elements in synchronous circuits. Herein, an active clock pulse is the time during a clock period that the clock signal is active.

FIG. 1(*c*) shows a well-known D-type latch formed with four NAND gates and an inverter. Data input signal D is provided on input terminal 1111 of NAND gate 1110 and input terminal 1151 of inverter 1150. Latch enable signal LE is provided on input terminal 1112 of NAND gate 1110 and input terminal 1131 of NAND gate 1130. Output terminal 1123 of NAND gate 1120 provides data output signal Q. Output terminal 1143 of NAND gate 1140 provides inverted data output signal !Q.

FIG. 1(*d*) shows a well known D-type latch formed with a transmission gate (TG) and three inverters. Data input signal D is provided on data input terminal 1212 of transmission gate 1210. Latch enable signal LE is provided on control input terminal 1213 of transmission gate 1210, while an inverted latch enable signal !LE is coupled to inverted control input terminal 1211 of transmission gate 1210. Output terminal 1242 of inverter 1240 provides data output signal Q, while output terminal 1222 of inverter 1220 provides inverted data output signal !Q.

A D-type flip-flop, which changes values only during a clock transition or active edge, is better suited as the storage element of synchronous circuits than the D-type latch. FIG. 2(*a*) shows the logic diagram of D-type flip-flop 2410 having data input terminal D, clock input terminal CLK, data output terminal Q, and inverted data output terminal !Q. To avoid confusion, signals on the various terminals are given the same names as the terminals themselves, whenever possible. Further, the same reference numeral is used for the terminal of D-type flip-flop 2410 and the line connected to that terminal. Typically, for D-type flip-flops, rising edges are active edges and falling edges are used for inactive edges. However, in some circuits falling edges are used for active edges and rising edges are inactive edges.

On active (rising) edge 2421 (FIG. 2(*b*)) of clock input signal CLK, D-type flip-flop 2410 passes signal V1 on data input terminal D to data output signal Q, which changes to signal V1 after a time delay T_cq (clock-to-out), representing the propagation delay of D-type flip-flop 2410. D-type flip-flop 2410 ignores changes to data input signal D, such as the transition from signal V1 to signal V2, until active (rising) edge 2422 of clock input signal CLK. At active (rising) edge 2422, data input terminal D is receiving signal V3. Therefore, after time delay T_cq data output signal Q is also signal V3.

For D-type flip-flop 2410 to function properly, data input signal D must satisfy two timing constraints, a setup time and a hold time, with respect to active edges of clock input signal CLK. Setup time T_setup is the minimum time that data input signal D must be at the proper signal level before the active clock edge. Hold time T_hold is the minimum time that data input signal D must remain at the proper signal level after the active clock edge. If either the setup time or hold time is violated, data output signal Q of D-type flip-flop 2410 is undeterminable.

The D-type flip-flop can be implemented using many well known circuits. The exact details of each implementation are dependent upon the process technology and available semiconductor area. At the logic gate level, the only important characteristics of a D-type flip-flop are given by the timing relationships among the signals on data input terminal D, data output terminal Q, and clock input terminal CLK.

FIG. 2(*c*) shows a well known edge-triggered D-type flip-flop formed from six NAND gates. Data input signal D enters on input terminal 2142 of NAND gate 2140. Clock input signal CLK is coupled to input terminal 2122 of NAND gate 2120 as well as input terminal 2132 of NAND gate 2130. Output terminal 2153 of NAND gate 2150 provides data output signal Q; and output terminal 2163 of NAND gate 2160 provides inverted data output signal !Q.

FIG. 2(*d*) shows a well known master-slave D-type flip-flop constructed with two transmission gates and five inverters. Data input signal D is coupled to input terminal 2211 of transmission gate 2210. Clock input signal CLK is coupled to inverted control input terminal 2212 of transmission gate 2210 as well as control input terminal 2243 of transmission gate 2240. Inverted clock input signal !CLK is coupled to control input terminal 2213 of transmission gate 2210 as well as inverted control input terminal 2242 of transmission gate 2240. Output terminal 2252 provides data output signal Q while output terminal 2272 provides inverted data output signal !Q.

FIG. 2(*e*) shows a well known pulse D-type flip-flop. Input signal D is coupled to data input terminal 2331 of transmission gate 2330. Inverted clock input signal !CLK is coupled to input terminal 2311 of OR gate 2310 as well as to input terminal 2361 of inverter 2360. Clock input signal CLK is coupled to input terminal 2321 of AND gate 2320 as well as input terminal 2371 of inverter 2370. Output terminal 2382 provides data output signal Q. Output terminal 2352 provides inverted data output signal !Q.

A typical synchronous circuit has many instances where the data output terminal of a first storage element is coupled to the data input terminal of a second storage element. As mentioned above D-type flip-flops are the most common storage elements used in synchronous circuits. FIG. 3(*a*) illustrates this circuit. Data input signal D1 is coupled to data input terminal 3111 of D-type flip-flop 3110. Clock input signal CLK1 is coupled clock input terminal 3112 of D-type flip-flop 3110. Clock input signal CLK1 is also coupled to clock input terminal 3122 of D-type flip-flop 3120. However, as a result of propagation delay T_skew, symbolized by box 3140, the signal at clock input terminal 3112 is skewed from the signal at clock input terminal 3122. For clarity, the skewed clock input signal at input terminal 3122 of D-type flip-flop 3120 is labeled CLK2. As shown in FIG. 3(*b*), skewing prevents transitions in clock input signal CLK1 and clock input signal CLK2 from occurring simultaneously. Data output terminal 3113 of D-type flip-flop 3110, providing data output signal Q1, is coupled to input terminal 3121 of D-type flip-flop 3120, with a propagation delay, T_d, symbolized by box 3130. For clarity, the delayed data output signal of D-type flip-flop 3110 at input terminal 3121 of D-type flip-flop 3120 is labeled D2. Although not shown, data output signal Q1 of D-type flip-flop 3110 may pass through some combinatorial logic elements before reaching D-type flip-flop 3120. Output terminal 3123 provides data output signal Q2 to other parts of the synchronous circuit.

FIG. 3(*b*) shows the timing diagram of the circuit of FIG. 3(*a*). Clock input signal CLK1 and clock input signal CLK2 are offset by time interval T_skew. Data output signal Q1 changes state at time interval T_cq after the active (rising) edge of clock input signal CLK1. Data input signal D2 is offset from data output signal Q1 by time interval T_d. For D-type flip-flop 3120 to function reliably, data input signal D2 must remain valid for at least hold time T_hold after each active (rising) edge of clock input signal CLK2. For board level circuits, time intervals T_skew, T_cq, T_d, and T_hold are measured in nanoseconds. For chip level circuits, these time intervals would be measured in picoseconds.

Since data input signal D2 must be valid for time interval T_hold, the following timing relationship can be derived for the circuit of FIG. 3(*a*) to avoid a hold time violation:

$$T_d > T_skew + T_hold - T_cq.$$

The conventional method to fix a hold time violation in a circuit is to insert delaying elements, such as buffers or an even number of inverters, between data output terminal 3113 of D-type flip-flop 3110 and data input terminal 3121 of D-type flip-flop 3120. Typically, enough delaying elements are added to increase time interval T_d and thereby avoid a hold time violation.

However, there are several problems with this conventional solution. If the clock frequency of the circuit is changed, time interval T_skew, as well as other propagation delays also change. Furthermore, if the circuit is modified, such as rerouting to accommodate changes in the circuit, or shrunk such as switching an IC to a smaller geometry size, the various propagation delays as well as switching times of the flip-flops and delaying elements also change. Therefore, the delaying elements may not delay the data signal long enough to avoid a hold time violation. Finally, the insertion of the delaying elements would require rerouting of the board or chip which contains the hold time violation.

Hence there is a need for a method or circuit to correct hold time violations that does not require rerouting of the board or chip and is impervious to changes in the chip or board such as changes in clock frequencies, geometry size, layout, or routing.

SUMMARY OF THE INVENTION

In accordance with this invention, a hold time violation is eliminated using a DE-type flip-flop. According to the principles of this invention, by properly sizing the DE-type flip-flop, corrections to circuits containing hold time violations can be accomplished without necessitating adjusting the placement of gates or rerouting of wires. Furthermore, a DE-type flip-flop provides an interval of protection that is a predetermined fraction of the clock period. Therefore, the correction of a hold time violation using the present invention is immune to changes in clock frequency, since the interval of protection also changes.

The DE-type flip-flop latches a data signal, appearing on the data input terminal of the DE-type flip-flop a predetermined fraction of a clock period before a first active edge. After the first active edge, the DE-type flip-flop provides the data signal on the data output terminal of the DE-type flip-flop. The DE-type flip-flop maintains the data signal on the data output terminal of the DE-type flip-flop for a clock period. Since the DE-type flip-flop latches an incoming data signal a predetermined fraction of a clock period before the next active clock edge, the hold time violation is eliminated. The DE-type flip-flop latching a half clock period early can be implemented by coupling the data output terminal of a latch to the data input terminal of a flip-flop, coupling the latch enable terminal of the latch to a clock input signal, and coupling the clock input terminal of the flip-flop to the same clock input signal.

BRIEF DESCRIPTION OF THE DRAWINGS

FIG. 1(*b*) is a timing diagram for a prior art D-type latch.

FIG. 1(*c*) is a schematic for one implementation of a prior art D-type latch.

FIG. 1(*d*) is a schematic for another implementation of a prior art D-type latch.

FIG. 2(*b*) is a timing diagram for a prior art D-type flip-flop.

FIG. 2(*c*) is a schematic for one implementation of a prior art D-type flip-flop.

FIG. 2(*d*) is a schematic for one implementation of a prior art master-slave D-type flip-flop.

FIG. 2(*e*) is a schematic for one implementation of a prior art pulse D-type flip-flop.

FIG. 3(*b*) is a timing diagram for the circuit of FIG. 3(*b*).

FIG. 4(*b*) is a timing diagram of the DL-type flip-flop, which can be used to correct hold time violations.

FIG. 4(*c*) is a block diagram of one embodiment of the DL-type flip-flop, which can be used to correct hold time violations.

FIG. 4(*d*) is a schematic of one embodiment of the DL-type flip-flop, which can be used to correct hold time violations.

FIG. 4(*e*) is another illustration of the timing of the DL-type flip-flop, which can be used to correct hold time violations.

FIG. 4(*f*) is a block diagram of one embodiment of the DL-type flip-flop, which can be used to correct hold time violations with alternative input clock signals.

FIG. 4(*g*) is a timing diagram of the DL-type flip-flop, which can be used to correct hold time violations with the alternative input clock signals.

FIG. 5(*b*) is a timing diagram for the circuit of FIG. 5(*a*).

FIG. 6(*b*) is a timing diagram of the DE-type flip-flop, which can be used to correct hold time violations.

FIG. 6(*c*) is a block diagram of one embodiment of the DE-type flip-flop, which can be used to correct hold time violations.

FIG. 6(*d*) is a schematic of one embodiment of the DE-type flip-flop, which can be used to correct hold time violations.

FIG. 8(*b*) is a block diagram of the prior art integrated circuit modified to include the flip-flops of this invention.

Herein, objects with the same reference numeral are the same object. Also, the first number of a reference numeral indicates the Figure where the object first appeared.

DETAILED DESCRIPTION

Figure 1B:
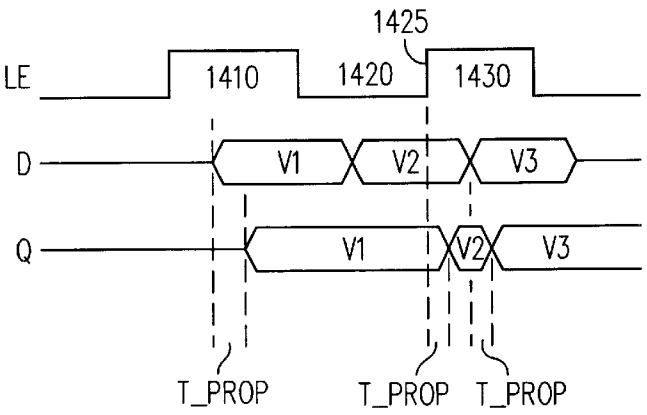
FIG. 1b (PRIOR ART)
FIG. 1(*a*) illustrates a prior art logic symbol for a D-type latch.
Figure 1D:
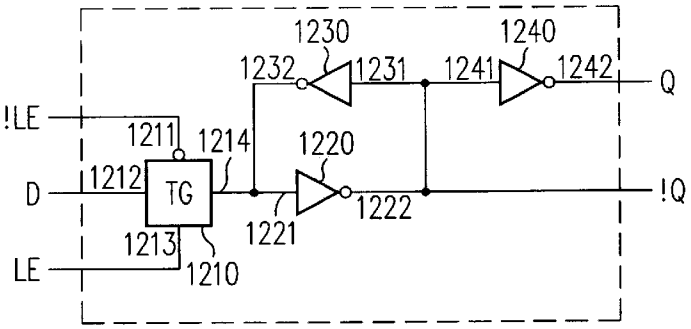
FIG. 1d (PRIOR ART)
Figure 1A:
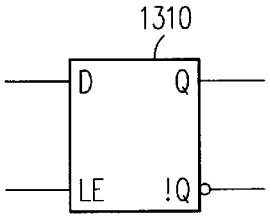
FIG. 1a (PRIOR ART)
Figure 1C:
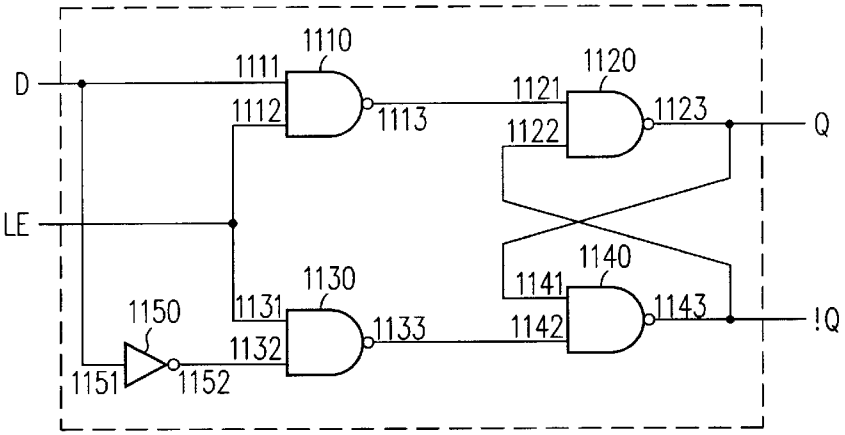
FIG. 1c (PRIOR ART)
Figure 2C:
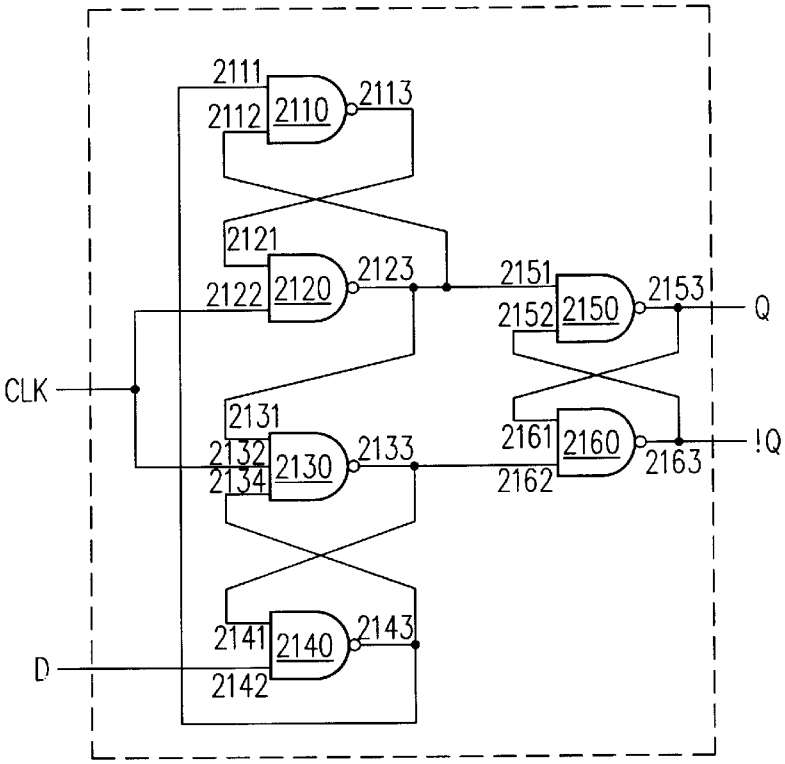
FIG. 2c (PRIOR ART)
FIG. 2(*a*) illustrates a prior art logic symbol for a D-type flip-flop.
Figure 2A:
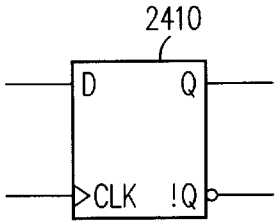
FIG. 2a (PRIOR ART)
Figure 2B:
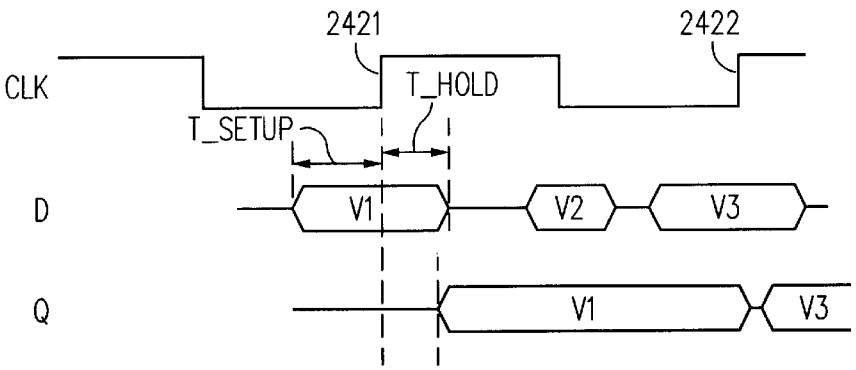
FIG. 2b (PRIOR ART)
Figure 2D:
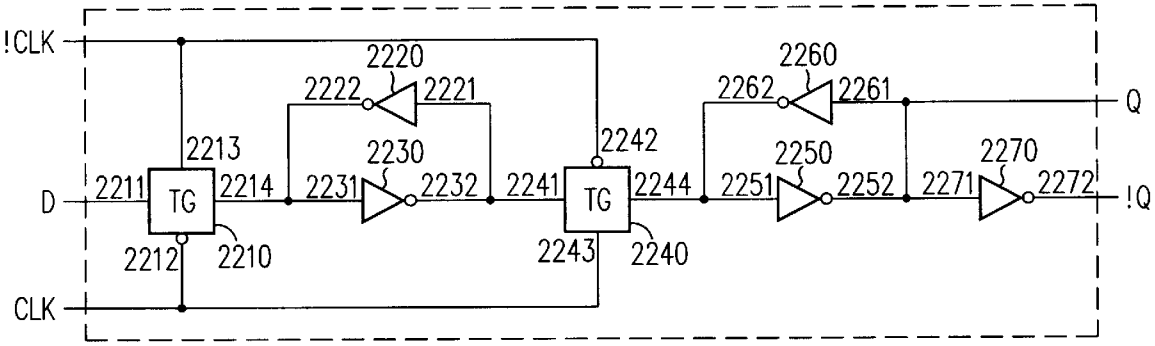
FIG. 2d (PRIOR ART)
Figure 2E:
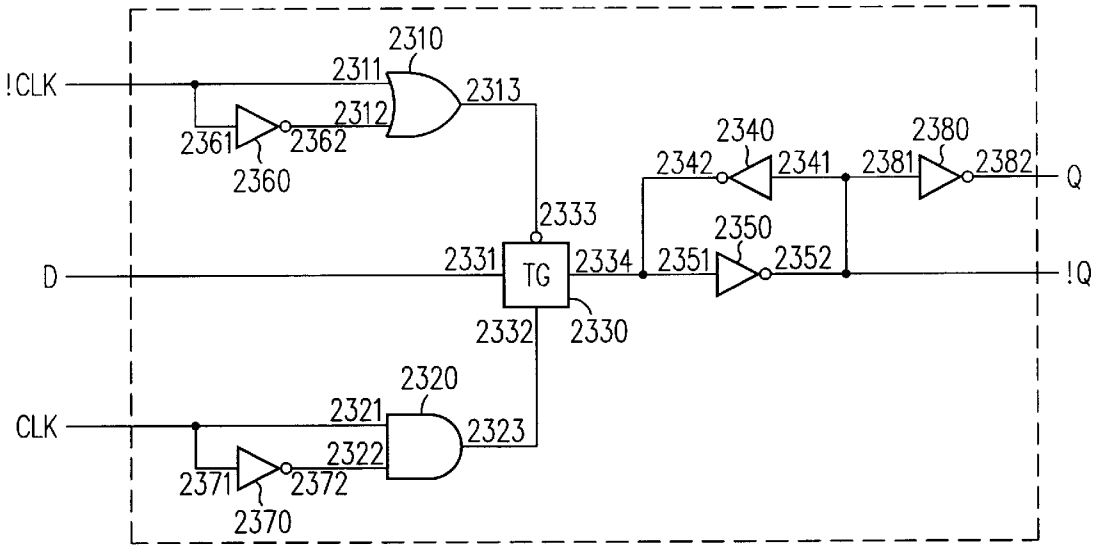
FIG. 2e (PRIOR ART)

According to the principles of this invention, the limitations associated with using delaying elements to prevent hold time violations have been overcome by a novel FC-type storage element. In one embodiment, the FC-type storage element of this invention is a DL-type flip-flop that holds the outgoing data signal for a fraction of a clock period later than prior art flip-flops. Alternatively, a DE-type flip-flop of the invention samples the incoming data a fraction of a clock period earlier than prior art flip-flops. Since the FC-type storage element controls the signal timing based on the clocking frequency, the FC-type storage element is immune to changes in clock frequency. Furthermore, by providing a timing delay equal to a fraction of the clock period, the FC-type storage element functions properly even if the timing of the circuit is modified due to changes on the board or chip. Finally, the DL-type flip-flop and DE-type flip flop of the invention can replace conventional flip-flops without requiring modification of surrounding circuits.

FIG. 4(*a*) shows a logic symbol for a delayed output storage element, i.e. a DL-type flip-flop 4000, which eliminates prior art hold time violations. DL-type flip-flop 4000 includes data input terminal DL, various clock input terminals CLK1 to CLKN, data output terminal Q_DL, and inverted data output terminal !Q_DL. To avoid confusion, the signals on the various terminals are called by the same name as the terminals.

Depending on the specific implementation of DL-type flip-flop 4000, various clock input signals are required. For example, one embodiment requires a main system clock signal and an inverted version of the main system clock signal. Alternatively, another embodiment of DL-type flip-flop 4000 generates an inverted clock signal internally by providing clock signal CLK1 to an internal inverter. Other clock signals that could be used include clock signals at various multiples or fraction of the main system clock signal. For example, an embodiment of DL-type flip-flop 4000 with a quarter clock period delay can be implemented with a main system clock signal and a clock signal at twice the frequency of the main system clock signal. Furthermore, if inverted data output signal !Q_DL is not required, inverted data output terminal !Q_DL can be eliminated.

FIG. 4(*b*) shows a timing diagram of one embodiment of DL-type flip-flop 4000, which delays data output signal Q_DL by half a clock period compared to prior art D-type flip-flops. DL-type flip-flop 4000 also has a propagation delay T_DL in addition to the intentional half clock period delay. DL-type flip-flop 4000, stores signal V1 of data input signal D on active (rising) edge 4020 of clock input signal CLK. Data output signal Q_DL becomes valid having signal V1,a time interval T_DL after inactive (falling) edge 4030 of clock input signal CLK.

Data output signal Q_DL remains valid with signal V1 until time interval T_DL after inactive (falling) edge 4050 of clock input signal CLK. at which time, data output signal Q_DL transitions to signal V2, the value of data input signal D at active (rising) edge 4040. Compared to standard flip-flops, data output signal Q_DL of DL-type flip-flop 4000 is delayed a half clock period (as explained more completely below). DL-type flip-flop 4000 can also be configured to work with opposite polarity so that active edges are falling edges and inactive edges are rising edges.

FIG. 4(*c*) shows one embodiment of DL-type flip-flop 4000. The embodiment of FIG. 4(*c*) includes a D-type flip-flop 4110 coupled to D-type latch 4120 and configured so that data output signal Q_DL is generated half a clock period after the data output signal of standard D-type flip-flops. Consequently, data output signal Q_DL remains valid half a clock period longer than the data output signal of standard D-type flip-flops.

In this embodiment, data input terminal D of D-type flip-flop 4110 is data input terminal DL of DL-type flip-flop 4000. Similarly, clock input terminal CLK of D-type flip-flop 4110 is clock input terminal CLK1 of DL-type flip-flop 4000; latch enable input terminal LE of D-type latch 4120 is clock input terminal CLK2 of DL-type flip-flop 4110; data output terminal Q of D-type latch 4120 is data output terminal Q_DL of DL-type flip-flop 4000; and inverted output terminal !Q of D-type latch is inverted data output terminal !Q_DL of DL-type flip-flop 4000.

Active (rising) edge 4500 (FIG. 4(*e*)) of clock input signal CLK on clock input terminal CLK of D-type flip-flop 4110 clocks input data signal V1 on data input terminal D of D-type flip-flop 4110 to data output terminal Q of D-type flip-flop 4110 as data output signal Q-standard. Data output signal Q-standard becomes valid at a time interval T_cq after active (rising) edge 4500 of clock input signal CLK. Data output signal Q-standard remains valid until the end of time interval T_cq after the next active (rising) edge of clock signal CLK. Data output signal Q-standard drives data input terminal D of D-type latch 4120. D-type latch 4120 is placed in close proximity to D-type flip-flop 4110. Therefore, there is only negligible skewing and propagation delay between the two devices. Data output signal Q-standard is not immediately passed through D-type latch 4120 because latch enable signal LE is inverted clock input signal !CLK. Therefore, data output signal Q-standard from D-type flip-flop 4110 is not passed through D-type latch 4120 until inverted clock input signal !CLK acting as latch enable signal LE goes active (high), corresponding to inactive (falling) edge 4510 of clock input signal CLK. The output signal on data output terminal Q of D-type latch 4120 is signal Q_DL. Thus, signal V1 becomes valid as signal Q_DL at the end of propagation delay T_prop of D-type latch 4120, after inactive (falling) edge 4510. Therefore, in these embodiments, time interval T_DL is equal to time interval T_prop. At active (rising) edge 4520, D-type latch 4120 latches the data so that data output signal Q_DL remains at signal V1 until time interval T_prop after inactive (falling) edge 4530.

Consequently, data output signal Q_DL on data output terminal Q of D-type latch 4120 is delayed a half clock period after the data output signal of standard D-type flip-flops. Similarly, inverted data output terminal !Q of D-type latch 4120 provides inverted data output signal !Q_DL delayed a half clock period after the inverted data output signal of standard D-type flip-flops.

FIG. 4(*d*) shows a gate level implementation of the embodiment of FIG. 4(*c*) using a master-slave D-type flip-flop and a D-type latch, formed using a transmission gate and three inverters. Other implementations are also possible for example, the edge triggered D-type flip-flop of FIG. 2(*c*), or the pulse flip-flop of FIG. 2(*e*) can be combined with the NAND gate based D-type latch of FIG. 1(*c*). Furthermore, the DL-type flip-flop can be made to function at opposite polarity, in which case D-type flip-flop 4110 is made to transition on the falling edge of clock input signal CLK and D-type latch 4120 receives clock input signal CLK instead of inverted clock input signal !CLK. In addition one skilled in the art can design a DL-type flip-flop using the principles of the present invention with other circuits, such as the JK-type flip-flop or SR-latch.

In FIG. 4(*d*), data input signal DL is provided on input terminal 4211 of transmission gate 4210. Clock input signal CLK is provided on inverted control input terminal 4212 of transmission gate 4210, control input terminal 4243 of transmission gate 4240, and inverted control input terminal 4272 of transmission gate 4270. Inverted clock input signal !CLK is provided on control input terminal 4213 of transmission gate 4210, inverted control input terminal 4242 of transmission gate 4240 as well as control input terminal 4273 of transmission gate 4270. Data output terminal 4214 of transmission gate 4210 is coupled to input terminal 4231 of inverter 4230. Output terminal 4232 of inverter 4230 is coupled to input terminal 4221 of inverter 4220. Output terminal 4222 of inverter 4220 is coupled to input terminal 4231 of inverter 4230. Output terminal 4232 of inverter 4230 is also coupled to data input terminal 4241 of transmission gate 4240. Data output terminal 4244 of transmission gate 4240 is coupled to input terminal 4261 of inverter 4260. Output terminal 4262 of inverter 4260 is coupled to input terminal 4251 of inverter 4250 as well as data input terminal 4271 of transmission gate 4270. Output terminal 4252 of inverter 4250 is coupled to input terminal 4261 of inverter 4260. Data output terminal 4274 of transmission gate 4270 is coupled to input terminal 4291 of inverter 4290. Output terminal 4292 is coupled to input terminal 4281 of inverter 4280 and input terminal 4301 of inverter 4300. Output terminal 4282 of inverter 4280 is coupled to input terminal 4291 of inverter 4290. Output terminal 4292 of inverter 4290 also provides the inverted data output signal !Q_DL. Output terminal 4302 of inverter 4300 also provides data output signal Q_DL.

FIG. 4(*f*) shows another embodiment of DL-type flip-flop 4000 having the timing characteristics shown in FIG. 4(*g*). The embodiment of FIG. 4(*f*) includes a D-type flip-flop 4310 coupled to D-type latch 4320 and configured so that data output signal Q_DL is generated a quarter of a clock period after the data output signal of standard D-type flip-flops. Consequently, data output signal Q_DL remains valid a quarter of a clock period longer than the data output signal of standard D-type flip-flops.

Specifically, data input signal V1 is on data input terminal D of D-type flip-flop 4310 at active (rising) edge 4410. Active (rising) edge 4410 on clock input signal CLK on clock input terminal CLK of D-type flip-flop 4310 clocks input data signal V1 to data terminal Q of D-type flip-flop 4310 as data output signal Q-standard. Data output signal Q-standard drives data input terminal 4321 of D-type latch 4320. Data output signal Q-standard is not immediately passed through D-type latch 4120 because latch enable signal LE is inverted two times clock input signal !2x-CLK. Therefore, data output signal Q-standard from D-type flip-flop 4310 is not passed through D-type latch 4320 until the end of propagation delay time T_prop after active (rising) edge 4420 of inverted two times clock input signal !2x-CLK.

Consequently, data output signal Q_DL on data output terminal 4323 is delayed a quarter of a clock period after the data output signal of standard D-type flip-flops. Similarly, inverted data output terminal 4324 provides inverted data output signal !Q_DL delayed a quarter of a clock period after the inverted data output signal of standard D-type flip-flops.

Figure 3A:
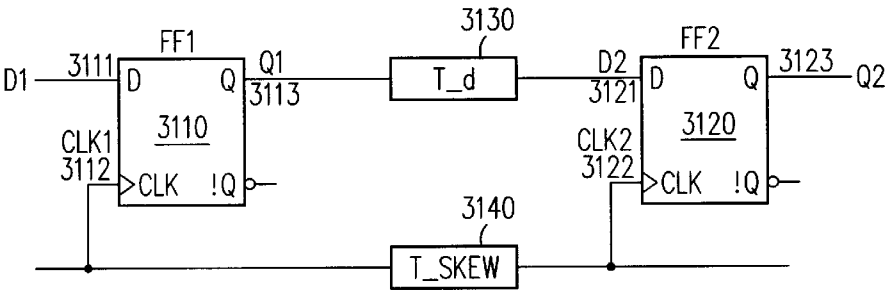
FIG. 3a (PRIOR ART)
FIG. 3(*a*) is an illustration of a part of a prior art synchronous circuit that include the prior art D-type flip-flop.
Figure 3B:
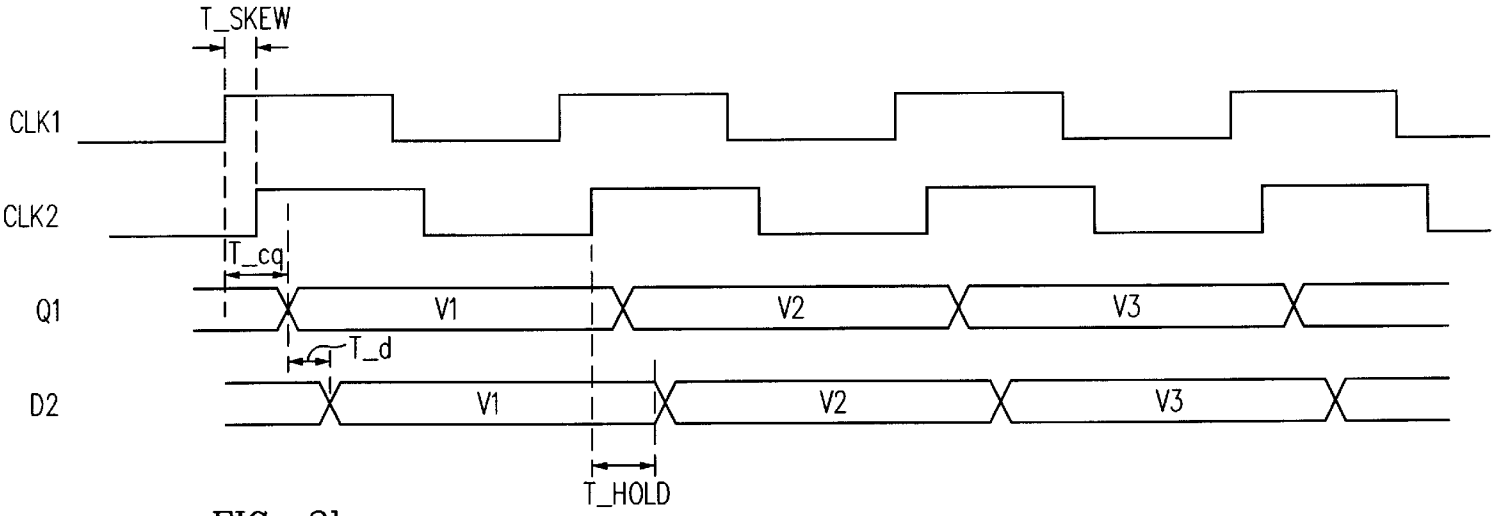
FIG. 3b (PRIOR ART)
Figure 4A:
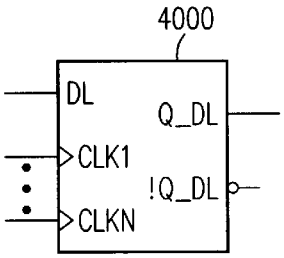
FIG. 4(*a*) is a logic symbol of a DL-type flip-flop, which can be used to correct hold time violations.
Figure 4B:
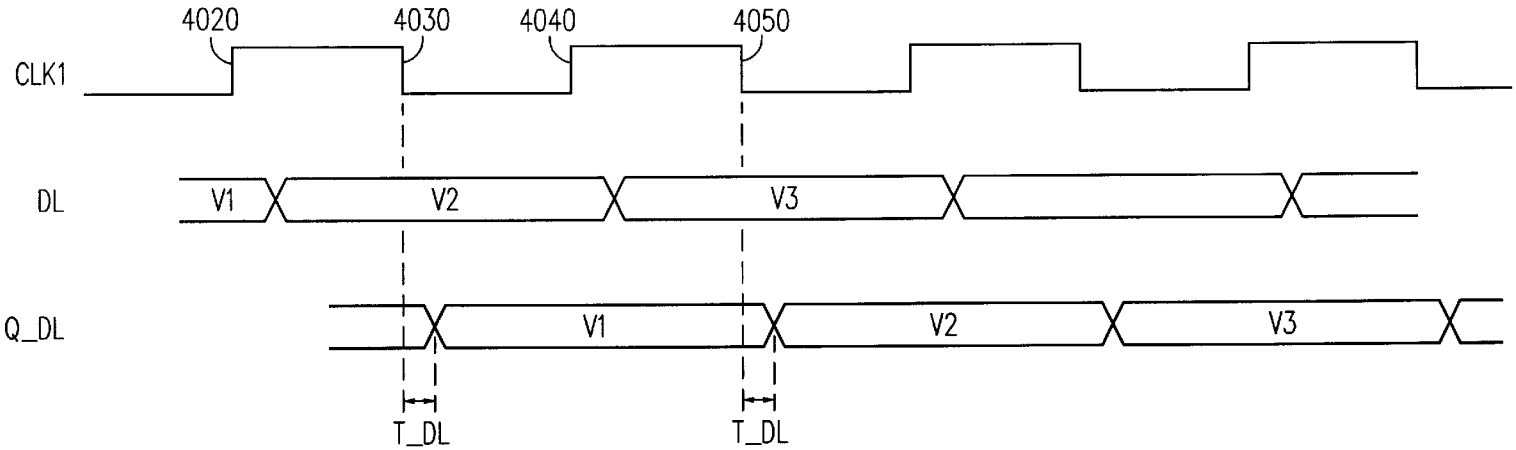
Figure 4C:
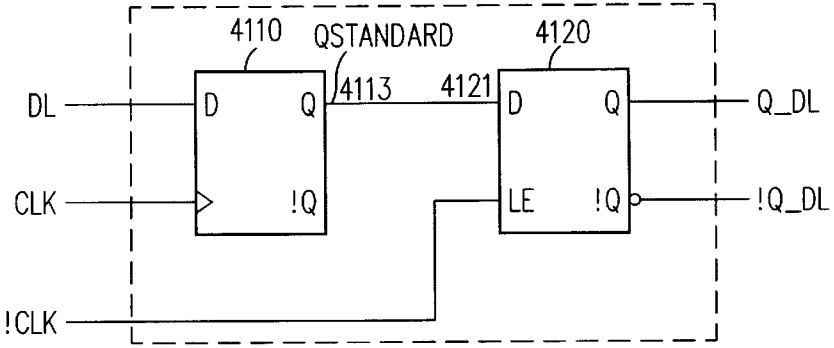
Figure 4D:
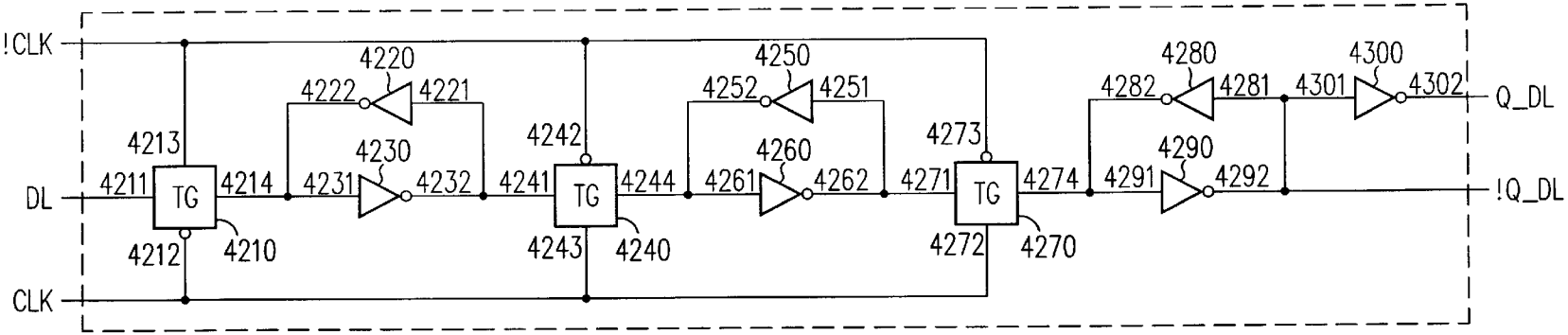
Figure 4E:
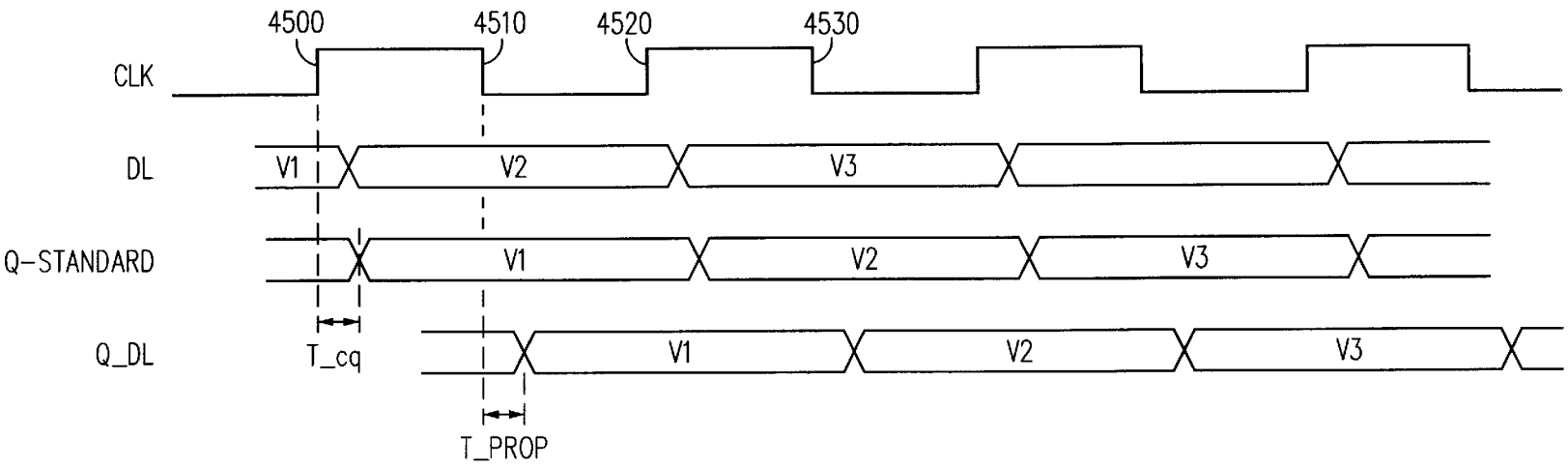
Figure 4F:
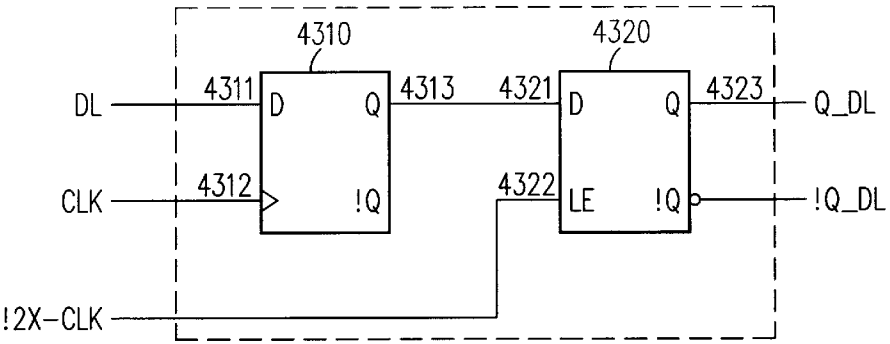
Figure 4G:
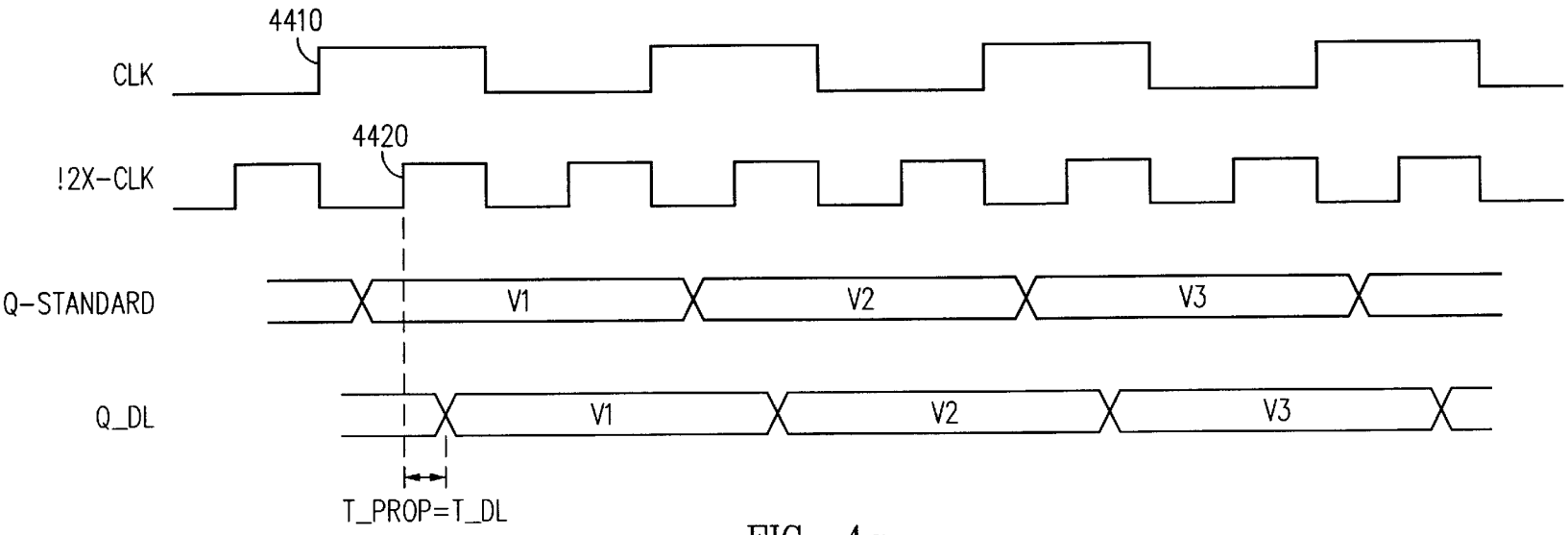
Figure 5A:
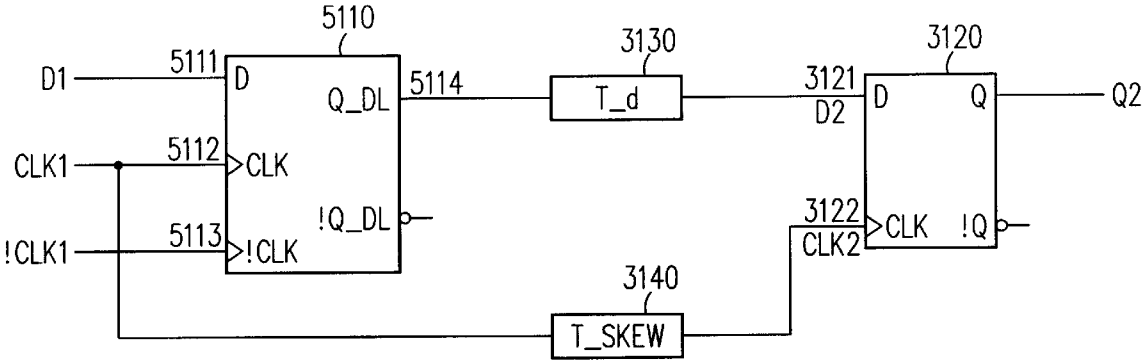
FIG. 5(*a*) illustrates the use of the DL-type flip-flop in a synchronous circuit to correct hold time violations.
Figure 5B:
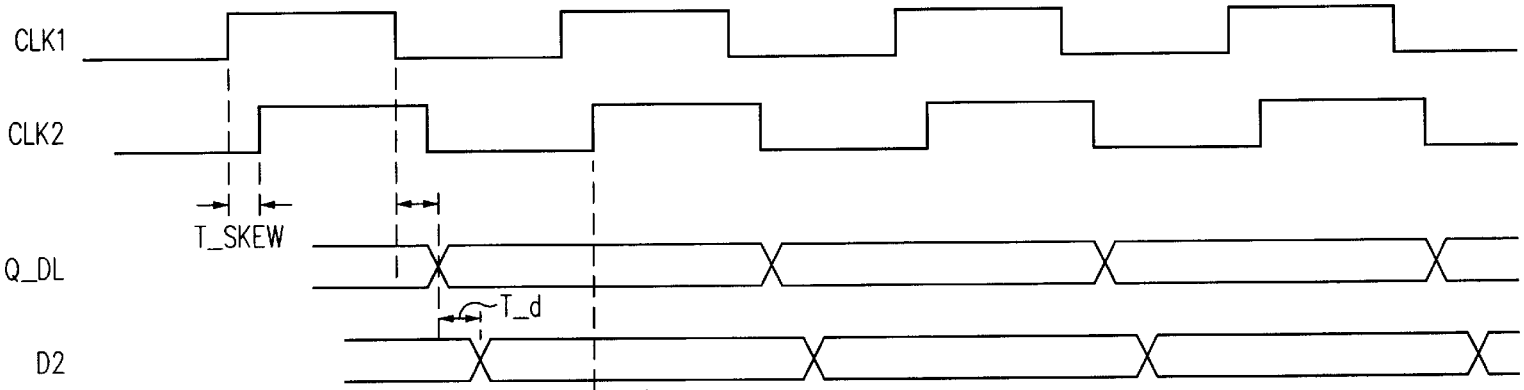
Figure 6A:
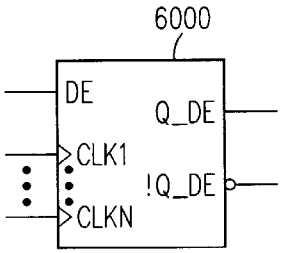
FIG. 6(*a*) is a logic symbol of a DE-type flip-flop, which can be used to correct hold time violations.
Figure 6B:
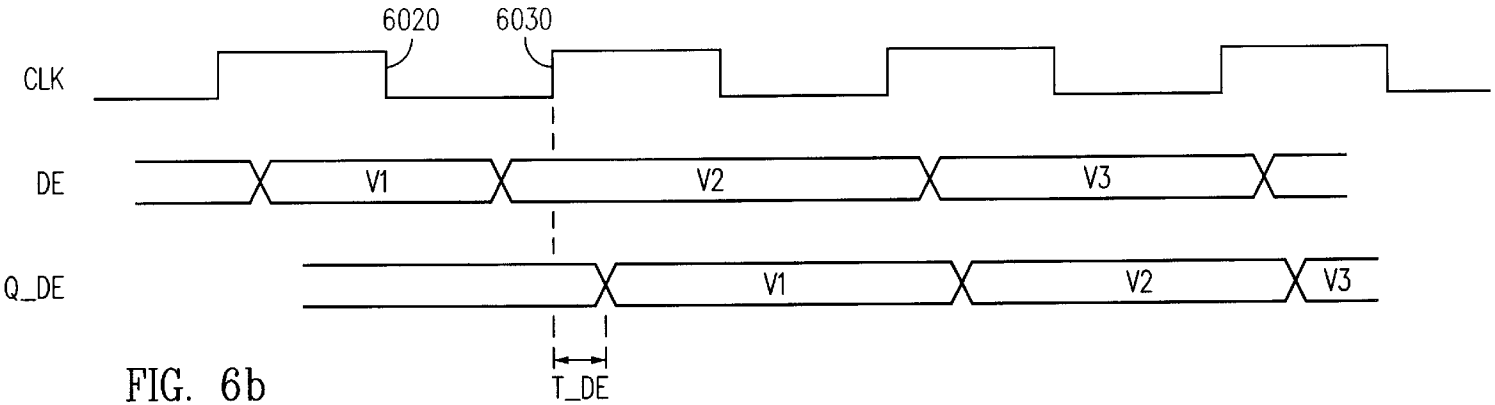
Figure 6C:
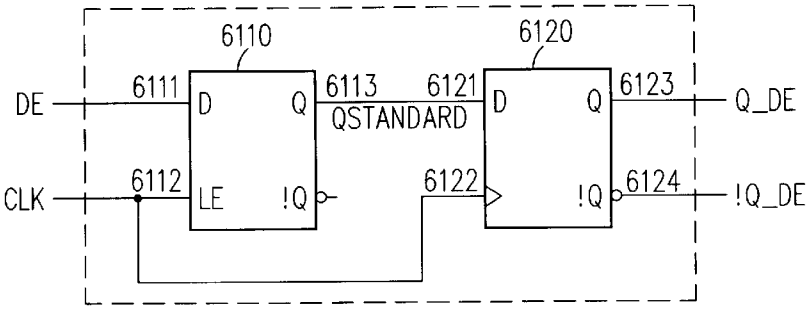
Figure 6D:
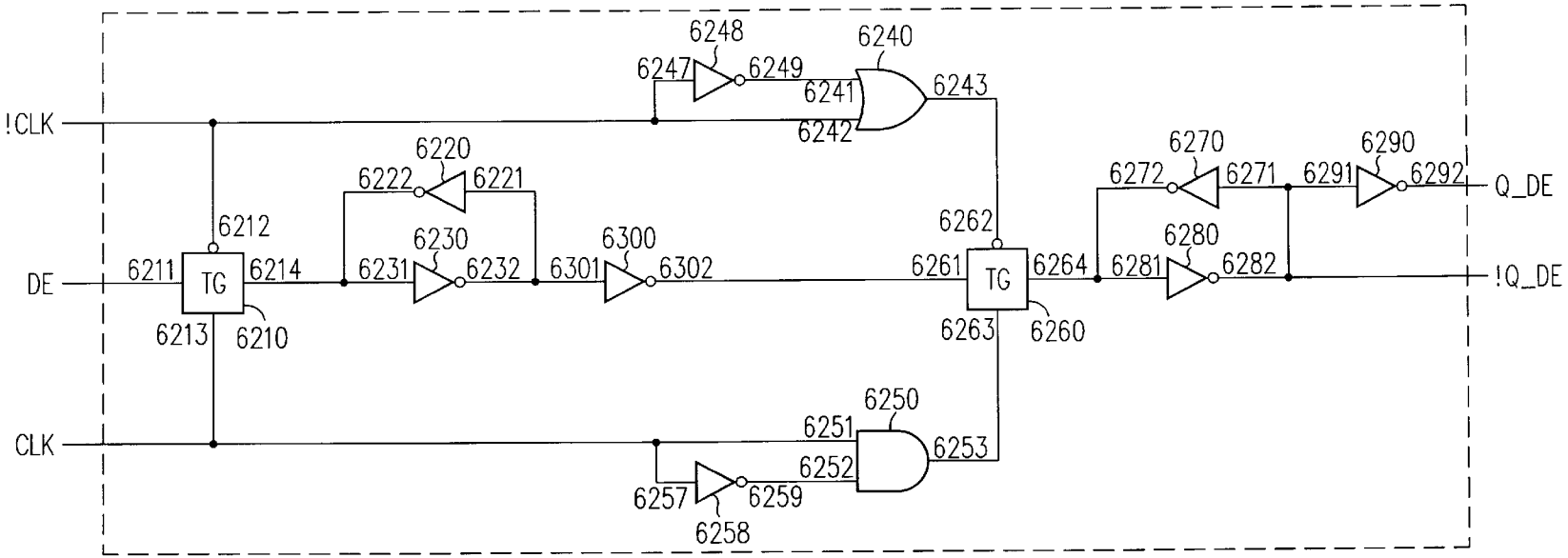

To correct a hold time violation, a DL-type flip-flop is used in place of D-type flip-flop 3110 in the representative circuit of FIG. 3(*a*), as shown in FIG. 5(*a*). FIG. 5(*b*) shows the timing diagram of the corrected circuit using a half clock period delay version of the DL-type flip-flop. Clock input signal CLK1 and clock input signal CLK2 are offset by time interval T_skew. Data output signal Q_DL changes state at the end of time interval T_DL after the inactive (falling) edge of clock input signal CLK1. Data input signal D2 is offset from data output signal Q_DL by time interval T_d. For D-type flip-flop 3120 to function reliably, data input signal D2 must remain valid for at least time interval T_hold, the hold time, after each active (rising) edge of clock input signal CLK2. As shown in FIG. 5(*b*), data input signal D2 is valid for approximately half a clock period after the active (rising) edge of clock input signal CLK2, which is greater than the hold time requirements of a flip-flop.

Using a DL-type flip-flop in place of D-type flip-flop 3110 corrects the hold time violation by delaying the output of D-type flip-flop 3110 by a half clock period. Another approach to correct a hold time violation is to replace D-type flip-flop 3120 with a DE-type flip-flop, which latches the incoming data signal a half clock period earlier than standard D-type flip-flops.

FIG. 6(*a*) shows a logic symbol for an early latching storage element, i.e. DE-type flip-flop 6000 of the present invention, which eliminates hold time violations when prior art D-type flip-flops, in which a hold time violation has occurred, is replaced by DE-type flip-flop 6000. DE-type flip-flop 6000 includes data input terminal DE, clock input terminals CLK1 to CLKN, data output terminal Q_DE, and inverted data output terminal !Q_DE. To avoid confusion, the signals on the various terminals are called by the same name as the terminal itself.

Depending on the specific implementation of DE-type flip-flop 6000, a variable number of clock input terminals receiving various clock input signals are used. Furthermore, inverted data output terminal !Q_DE, may be deleted if the inverted output data signal !Q_DE is not required.

FIG. 6(*b*), provides the timing characteristics for one embodiment of DE-type flip-flop 6000 which latches data input signal DE a half clock period earlier than standard D-type flip-flops. Data input signal DE is provided on data input terminal DE; clock input signal CLK is provided on clock input terminal CLK1, and data output signal Q_DE is provided by DE-type flip-flop 6000 on data output terminal Q_DE. On inactive (falling) edge 6020 of clock input signal CLK, DE-type flip-flop 6000 stores signal V1, the value of data input signal DE. DE-type flip-flop 6000 outputs signal V1 on data output terminal Q_DE after the end of time interval T_DE after active (rising) edge 6030. Time interval T_DE represents the propagation delay of DE-type flip-flop 6000. Compared to standard flip-flops, DE-type flip-flop 6000 latches data input signal DE at an earlier time (as explained more fully below). Therefore, data input signal DE does not need to be valid for the entire clock period when used with DE-type flip-flop 6000.

FIG. 6(*c*) shows one embodiment of DE-type flip-flop 6000. The embodiment of FIG. 6(*c*) includes a D-type latch 6110 coupled to D-type flip-flop 6120. Specifically, data input signal DE is provided on data input terminal D of D-type latch 6110. Clock input signal CLK is provided to latch enable terminal LE of D-type latch 6110 as well as clock input terminal CLK of D-type flip-flop 6120.

Figure 7:
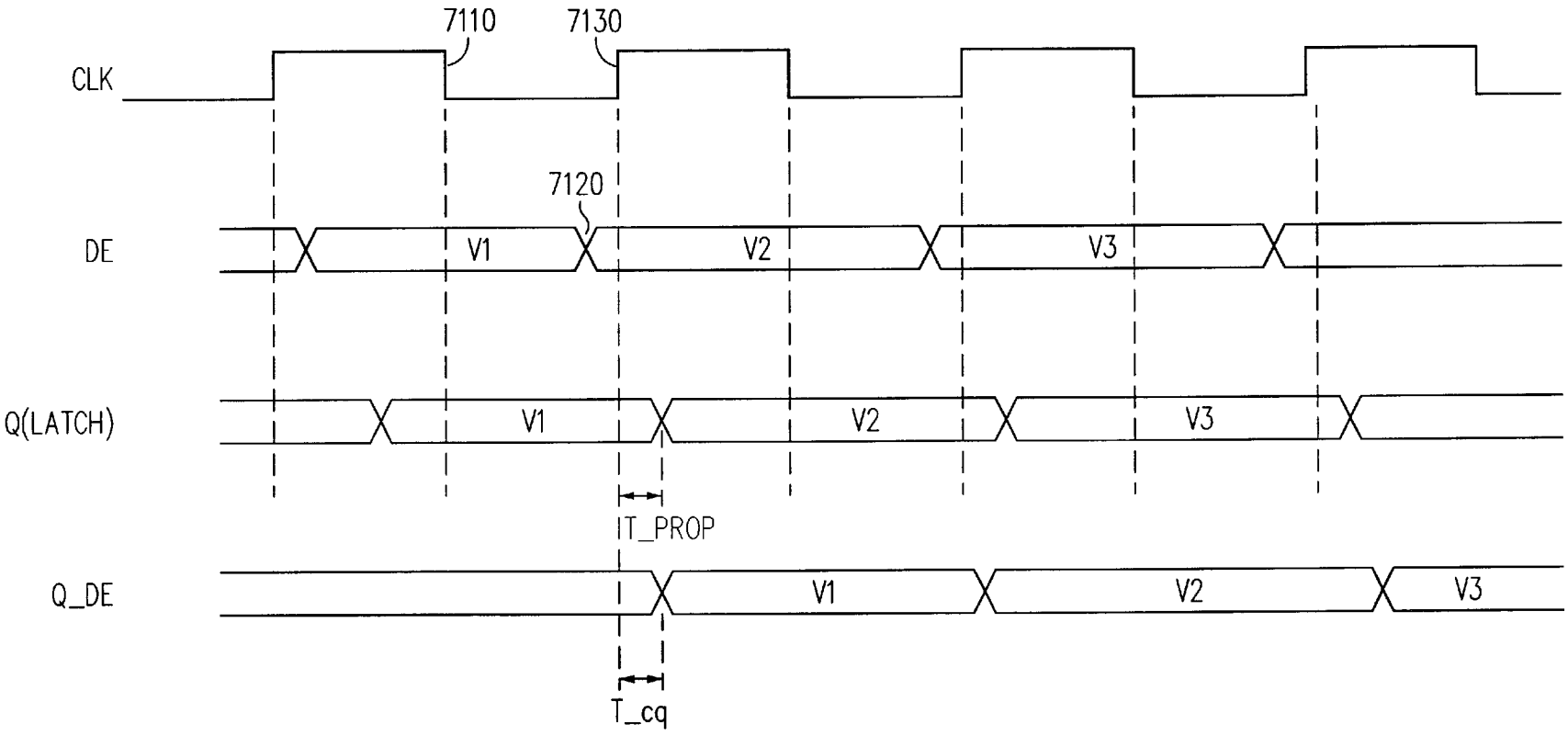
FIG. 7 shows the timing diagram for the circuit of FIG. 6.

In this embodiment data input terminal D of D-type latch 6120 is data input terminal DE of DE-type flip-flop 6000. Similarly, data output terminal Q of D-type flip-flop 6230 is data output terminal Q_DE of DE-type flip-flop 6000; and latch enable input terminal LE of D-type latch 6110 with clock input terminal CLK of D-type flip-flop 6120 are clock input terminal CLK of DE-type flip-flop 6000. Data output terminal Q of D-type latch 6110 is coupled to data input terminal D of D-type flip-flop 6120. For clarity the signal on data output terminal Q of D-type latch 6120 is referred to as Q(latch) in the timing diagram of FIG. 7. At inactive (falling) edge 7110 (FIG. 7) of clock input signal CLK, D-type latch 6110 latches signal V1 and ignores transition 7120 of data input signal DE from signal V1 to signal V2 until active (rising) edge 7130 of clock input signal CLK. At the end of time interval T_prop after active (rising) edge 7130, data output signal Q(latch) of D-type latch 6110 transitions to signal V2. Active (rising) edge 7130 also causes D-type flip-flop 6120 to clock in signal Vl from data output terminal Q(latch) of D-type latch 6110 which is connected to data input terminal D of D-type flip-flop 6120. At the end of time interval T_cq after active (rising) edge 7130 of clock input signal CLK, signal V1 propagates onto data output terminal Q of D-type flip-flop 6120, which corresponds to data output terminal Q_DE of DE-type flip-flop 6000. Therefore, transition 7120 of data input signal DE before active (rising) edge 7130, which would be a hold time violation for standard D-type flip-flops, does not effect DE-type flip-flop 6000, since this embodiment of DE-type flip-flop 6000 latches data input signal DE at inactive (falling) edge 7120 of clock input signal CLK. Since D-type latch 6110 is located very close to D-type flip-flop 6120, only negligible clock skew occurs. Therefore, as long as propagation delay T_prop of latch 6120 is greater than hold time T_hold of D-type flip-flop 6120, no hold time violation occurs.

FIG. 6(*d*) shows a gate level implementation of DE-type flip-flop 6000. In this particular implementation, a pulse flip-flop and a standard D-type latch, formed from a transmission gate and three inverters is used. Other implementations are possible, for example, the edge triggered flip-flop of FIG. 2(*c*) can be used in place of the pulse flip-flop or the D-type latch formed of four NAND gates can be used in place of the D-type latch used in FIG. 6(*d*). In addition one skilled in the art can design a DE-type flip-flop using the principles of the present invention with other circuits, such as the JK-type flip-flop or SR-latch.

In FIG. 6(*d*), data input signal DE is provided on data input terminal 6211 of transmission gate 6210. Clock input signal CLK is provided on control input terminal 6213 of transmission gate 6210, input terminal 6251 of AND gate 6250, and input terminal 6257 of inverter 6258. Inverter 6259 provides a slight delay to the AND gate to create a pulse for transmission gate 6260. Inverted clock input signal !CLK is provided on inverted control input terminal 6212 of transmission gate 6210, input terminal 6242 of OR gate 6240, and input terminal 6247 of inverter 6248. Inverter 6245 provides a slight delay on the inverter clock input signal to OR gate 6240 to create a pulse on output terminal 6243 of OR gate 6240. Data output terminal 6214 of transmission gate 6210 is coupled to input terminal 6231 of inverter 6230. Output terminal 6232 of inverter 6230 is coupled to input terminal 6301 of inverter 6300 as well as input terminal 6221 of inverter 6220. Output terminal 6222 of inverter 6220 is coupled to input terminal 6231 of inverter 6230. Output terminal 6302 of inverter 6300 is coupled to input terminal 6261 of transmission gate 6260. Output terminal 6243 of OR gate 6240 is coupled to inverted control input terminal 6262 of transmission gate 6260. Output terminal 6253 of AND gate 6250 is coupled to control input terminal 6263 of transmission gate 6260. Output terminal 6264 of transmission gate 6260 is coupled to input terminal 6281 of inverter 6280. Output terminal 6282 is coupled to input terminal 6271 of inverter 6270, as well as input terminal 6291 of inverter 6290. Output terminal 6272 is coupled to input terminal 6281 of inverter 6280. Output terminal 6292 of inverter 6290 provides data output signal Q_DE. Output terminal 6282 of inverter 6280 provides inverted data output signal !Q_DE.

DL-type flip-flop 4000 and DE-type flip-flop 6000 can be used in place of standard flip-flops in various synchronous circuits. However, since DL-type flip-flop 4000 and the DE-type flip-flop 6000 require more gates than standard flip-flops it is more economical to replace standard flip-flops only where a hold time violation occurs. A convenient method of eliminating a hold time violation is to define a macrocell using either DL-type flip-flop 4000 or DE-type flip-flop 4000 which has the same interconnections and requires the same area as standard flip-flop macrocells. DL-type flip-flop 400 and DE-type flip-flop 6000, which require more gates than standard flip-flops, can be made to use the same area as standard flip-flops using well known conventional shrinking techniques. On connections where a hold time violation occurs, the new macrocell is placed in the design instead of the standard macrocell. By using the same interconnection and area as the standard macrocell, no re-placement or re-routing of the chip is required.

Figure 8B:
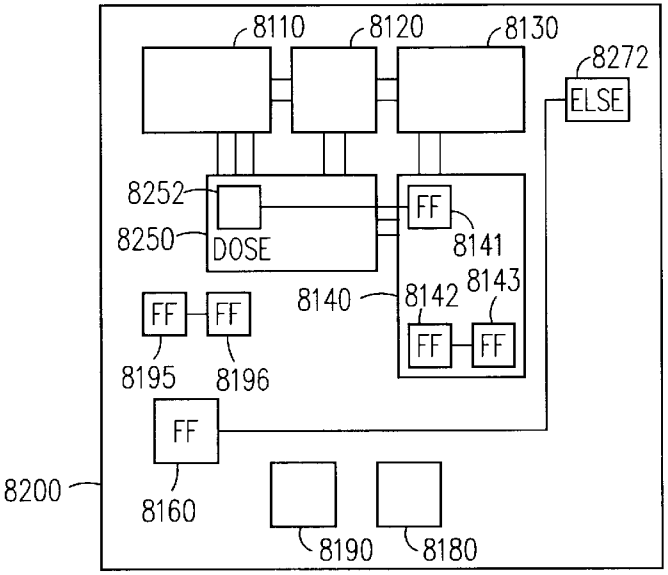
FIG. 8(*a*) is a block diagram of a prior art integrated circuit with flip-flops that have a hold time violation.
Figure 8A:
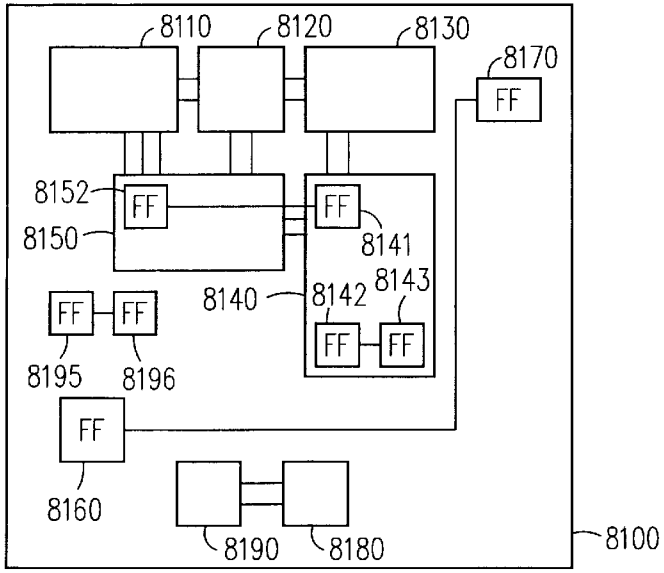

FIG. 8A shows chip 8100 containing various logic blocks. Flip-flops 8195 and 8196 are coupled as in FIG. 3(*a*). Since flip-flop 8195 and flip-flop 8196 are located in close proximity it is unlikely that a hold time violation occurs. However, a hold time violation could occur between flip-flop 8160 and flip-flop 8170 which are located at opposite ends of chip 8100. Similarly, a hold time violation may occur between flip-flop 8152 in block 8150 and flip-flop 8141 in block 8140. These hold time violations can be remedied without disturbing the rest of chip 8100 by using the principles of the present invention. Chip 8200 (FIG. 8B) is a corrected version of chip 8100. Flip-flop 8170 has been replaced with DE-type flip-flop 8172, which was made to use the same interconnection and area as flip-flop 8170. Furthermore, logic block 8150 has been replaced with logic block 8250 which contains DL-type flip-flop 8252 in place of flip-flop 8152. By replacing only the standard flip-flop macrocell, the placement and routing of other parts of chip 8100 are not disturbed.

On board level designs, hold time violations can be over come by creating a DL-type flip-flop or DE-type flip-flop to replace any chips containing standard flip-flops. In this way the other components on the board do not need to be rearranged or rerouted to correct the hold time violation.

The present invention can also be used between boards across a data bus. Clock input signals accompanying data across a bus between boards is likely to become skewed with respect to the data. The skewing of the clock input signal may create hold time violation on the receiving end. Using flip-flops according to the principles of this invention can eliminate these hold time violations.

Figure 9:
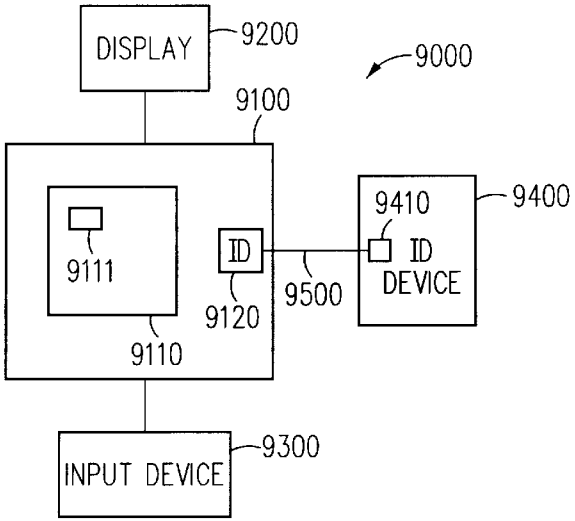
FIG. 9 shows a system in which the present invention can be used.

FIG. 9, illustrates a computer system 9000, having processing unit 9100, display 9200, input device 9300, and IO device 9400, which is coupled to processing unit 9100 through bus 9500. Processing unit 9100 contains motherboard 9110 and IO controller 9120. Motherboard 9110 contains chip 9111. The principles of this invention can be used to correct hold time violations on motherboard 9110, in chip 9111, as well as across bus 9500.

The various embodiments of the structure and method of this invention that are described above are illustrative only of the principles of this invention and are not intended to limit the scope of the invention to the particular embodiments described. In view of this disclosure, those skilled-in-the-art can define other flip-flop circuits, other latch circuits, other edge conditions, other hardware implementations, and use these alternative features to create a method, circuit, or system according to the principles of this invention.

We claim:

1. A DE-type flip-flop comprising a data input terminal;

a first clock input terminal wherein a first clock input signal on said first clock input terminal has a plurality of active edges, a plurality of nonactive edges, and a first clock input signal clock period; and a data output terminal coupled to said data input terminal in response to a first active edge of said first clock input signal;

wherein a data input signal on said data input terminal is sampled a predetermined fraction of said first clock input signal clock period before a first active edge of said first clock input signal; said data input signal is applied on said data output terminal in response to said first active edge; and said data input signal is maintained on said data output terminal for said first clock input signal clock period.

2. The DE-type flip-flop of claim 1, wherein said first active edge is a rising edge.

3. The DE-type flip-flop of claim 1, wherein said predetermined fraction is one-fourth.

4. The DE-type flip-flop of claim 1, wherein said predetermined fraction is one-half.

5. The DE-type flip-flop of claim 1, further comprising:

a latch having a latch data input terminal coupled to said data input terminal, a latch data output terminal, and a latch enable input terminal coupled to said first clock input terminal; and a flip-flop having a flip-flop data input terminal coupled to said latch data output terminal, a flip-flop data output terminal coupled to said data output terminal, and a flip-flop clock input terminal coupled to said first clock input terminal.

6. The DE-type flip-flop of claim 1, further comprising:

a second clock input terminal wherein a second clock input signal on said second clock input terminal has a second clock input signal clock period;

a latch having a latch data input terminal coupled to said data input terminal, a latch data output terminal, and a latch enable input terminal coupled to said first clock input terminal; and a flip-flop having a flip-flop data input terminal coupled to said latch data output terminal, a flip-flop data output terminal coupled to said data output terminal, and a flip-flop clock input terminal coupled to said second clock input terminal.

7. The DE-type flip-flop of claim 6, wherein said second clock input signal clock period is half of said first clock input signal clock period.

8. The DE-type flip-flop of claim 5, wherein said flip-flop is a master-slave D-type flip-flop.

9. The DE-type flip-flop of claim 5, wherein said latch further comprises a transmission gate having a transmission gate data input terminal coupled to said data input terminal, a first transmission gate control input terminal coupled to said first clock input terminal, a second transmission gate control input terminal coupled to a second clock input terminal, wherein said second clock input terminal receives an inverted version of said first clock input signal, and a transmission gate data output terminal;

a first inverter having a first inverter input terminal coupled to said transmission gate data output terminal and a first inverter output terminal; and a second inverter having a second inverter input terminal coupled to said first inverter output terminal and a second inverter output terminal coupled to both said first inverter input terminal and said data input terminal.

10. An DE-type flip-flop as in claim 1, wherein said data input terminal of said DE-type flip-flop is coupled to a second flip-flop data output terminal of a second flip-flop;

and said first clock input terminal of said DE-type flip-flop is coupled to a flip-flop clock input terminal of said second flip-flop.

11. The DE-type flip-flop of claim 10, wherein said DE-type flip-flop and said second flip-flop are on a single integrated circuit.

12. The DE-type flip-flop of claim 10, wherein said DE-type flip-flop is on a first integrated circuit and said second flip-flop is on a second integrated circuit.

13. The DE-type flip-flop of claim 10, wherein said DE-type flip-flop and said second flip-flop are on a single circuit board.

14. The DE-type flip-flop of claim 10, wherein said DE-type flip-flop is on a first circuit board and said second flip-flop is on a second circuit board.

15. The DE-type flip-flop of claim 10, wherein said second flip-flop data output terminal of said second flip-flop is coupled to said data input terminal of said DE-type flip-flop through at least one intermediate gate.

16. A DE-type flip-flop comprising a latch having a latch data input terminal, a latch data output terminal, and a latch enable input terminal;

a flip-flop having a flip-flop data input terminal connected directly to said latch data output terminal, a flip-flop data output terminal, and a flip-flop clock input terminal;

a DE data input terminal connected directly to said latch data input terminal;

a first DE clock input terminal coupled to said flip-flop clock input terminal;

a second DE clock input terminal coupled to said latch enable input terminal; and a DE data output terminal connected directly to said flip-flop data output terminal wherein a data input signal on said DE data input terminal is stored in said latch a predetermined fraction of a clock period of a clock input signal before a first active edge of said clock input signal on said first DE clock input terminal; said data input signal is applied on said DE data output terminal in response to said first active edge; and said data input signal is maintained on said DE data output terminal for said clock period of said clock input signal.

17. The DE-type flip-flop of claim 16, wherein said first DE clock input terminal is coupled to said second DE clock input terminal.

18. The DE-type flip-flop of claim 16, wherein said flip-flop is a master-slave D-type flip-flop.

19. The DE-type flip-flop of claim 16, wherein said latch further comprises a transmission gate having a transmission gate data input terminal coupled to said DE data input terminal, a first transmission gate control input terminal coupled to said first DE clock input terminal, a second transmission gate control input terminal; and a transmission gate data output terminal;

a first inverter having a first inverter input terminal coupled to said transmission gate data output terminal and a first inverter output terminal;

a second inverter having a second inverter input terminal coupled to said first inverter output terminal and a second inverter output terminal coupled to both said first inverter input terminal and said DE data input terminal; and a third DE clock input terminal coupled to said second transmission gate control input terminal.

20. An DE-type flip-flop as in claim 16, wherein said DE data input terminal is coupled to a second flip-flop data output terminal of a second flip-flop; and said first DE clock input terminal is coupled to a flip-flop clock input terminal of said second flip-flop.

21. The DE-type flip-flop of claim 20, wherein said DE-type flip-flop and said second flip-flop are on a single integrated circuit.

22. The DE-type flip-flop of claim 20, wherein said DE-type flip-flop is on a first integrated circuit and said second flip-flop is on a second integrated circuit.

23. The DE-type flip-flop of claim 20, wherein said DE-type flip-flop and said second flip-flop are on a single circuit board.

24. The DE-type flip-flop of claim 20, wherein said DE-type flip-flop is on a first circuit board and said second flip-flop is on a second circuit board.

25. The DE-type flip-flop of claim 20, wherein said second flip-flop data output terminal of said second flip-flop is coupled to said DE data input terminal through at least one intermediate gate.

26. A method of eliminating a hold time violation in a flip-flop having a flip-flop input terminal, a flip-flop output terminal, and a flip-flop clock input terminal, wherein a data input line is coupled to said flip-flop input terminal, said method comprising:

decoupling said data input line from said flip-flop input terminal;

coupling a latch output terminal of a latch to said flip-flop input terminal;

coupling said data input line to a latch input terminal of said latch wherein a data input signal on said data input line is stored in said latch a predetermined fraction of a clock input signal clock period before a first active edge of said clock input signal: said data input signal is applied on flip-flop output terminal in response to said first active edge: and said data input signal is maintained on said flip-flop output terminal for said first clock input signal clock period.

27. The method of eliminating a hold time violation in a flip-flop of claim 26, further comprising:

coupling a latch enable terminal of said latch to said flip-flop clock input terminal.

28. A method to eliminate hold time violations in a flip-flop comprising:

replacing said flip-flop with a DE-type flip-flop.

29. A method to create an integrated circuit design free of hold time violations comprising:

identifying a hold time violation; and inserting a DE-type flip-flop macrocell into said integrated circuit design, such that said hold time violation is eliminated.

30. The method to create an integrated circuit design in claim 29, wherein said DE-type flip-flop macrocell replaces a standard flip-flop macrocell.

31. The method to create an integrated circuit design in claim 29, wherein said DE-type flip-flop macrocell has a DL-type flip-flop area requirement equal to a standard flip-flop macrocell area requirement of said standard flip-flop macrocell.

* * * * *